(12) United States Patent
Hissen et al.

(10) Patent No.: US 8,249,207 B1
(45) Date of Patent: Aug. 21, 2012

(54) CLOCK AND DATA RECOVERY SAMPLER CALIBRATION

(75) Inventors: Jurgen Hissen, Port Moody (CA); Dragos Cartina, Burnaby (CA)

(73) Assignee: PMC-Sierra, Inc., Santa Clara, CA (US)

( * ) Notice: Subject to any disclaimer, the term of this patent is extended or adjusted under 35 U.S.C. 154(b) by 1188 days.

(21) Appl. No.: 12/040,585

(22) Filed: Feb. 29, 2008

(51) Int. Cl.
*H04L 7/02* (2006.01)
*H03D 3/02* (2006.01)

(52) U.S. Cl. ........................ 375/355; 375/375

(58) Field of Classification Search .................. 375/316, 375/354, 355, 373–376; 327/94, 95, 141, 327/144–157
See application file for complete search history.

(56) References Cited

U.S. PATENT DOCUMENTS

| | | | |
|---|---|---|---|
| 6,737,995 B2 | 5/2004 | Ng et al. | |
| 6,785,622 B2 | 8/2004 | Nygaard, Jr. | |
| 7,042,252 B2* | 5/2006 | Galloway et al. | 327/16 |
| 7,092,472 B2 | 8/2006 | Stojanovic | |
| 7,242,712 B1 | 7/2007 | Katic | |
| 7,292,670 B2* | 11/2007 | Gupta et al. | 375/371 |
| 7,339,989 B1 | 3/2008 | McAdam et al. | |
| 7,590,175 B2* | 9/2009 | Leibowitz et al. | 375/229 |
| 8,045,664 B2* | 10/2011 | Ozawa | 375/355 |
| 2005/0031065 A1* | 2/2005 | Gupta et al. | 375/371 |
| 2005/0237086 A1* | 10/2005 | Galloway et al. | 327/16 |
| 2006/0280272 A1* | 12/2006 | Stojanovic | 375/355 |
| 2007/0160173 A1* | 7/2007 | Takeuchi | 375/355 |
| 2008/0056344 A1* | 3/2008 | Hidaka | 375/232 |

OTHER PUBLICATIONS

Casper et al., "A 20Gb/s Forwarded Clock Transceiver in 90nm CMOS," *IEEE International Solid-State Circuits Conference*, ISSCC 2006 / Session 4 / Gigabit Transceivers / 4.6 (2006), pp. 1-10.

Larsson, P., "An Offset-Cancelled CMOS Clock-Recovery/Demux with a Half-Rate Linear Phase Detector for 2.5Gb/s Optical Communication," *IEEE International Solid-State Circuits Conference*, ISSCC 2001 Session 5 / Gigabit Optical Communications I / 5.1 (2001), pp. 1-3.

Liebowitz et al., "A 7.5Gb/s 10-Tap DFE Receiver with First Tap Partial Response, Spectrally Gated Adaptation, and $2^{nd}$-Order Data-Filtered CDR," IEEE International Solid-State Circuits Conference, ISSCC 2007 / Session 12 / Gigabit CDRs and Equalizers / 12.4 (2007), pp. 1-3.

Palmer et al., "A 14mW 6.25Gb/s Transceiver in 90nm CMOS for Serial Chip-to-Chip Communications," *IEEE International Solid-State Circuits Conference*, ISSCC 2007 / Session 24 / Multi-GB/s transceivers / 24.3 (2007), pp. 1-3.

Sonntag et al., "A Digital Clock and Data Recovery Architecture for Multi-Gigabit/s Binary Links," Synopsis, Inc.; pp. 537-544 (Sep. 2005).

* cited by examiner

*Primary Examiner* — Tesfaldet Bocure

(74) *Attorney, Agent, or Firm* — Knobbe, Martens, Olson & Bear LLP

(57) ABSTRACT

Methods and apparatus are disclosed, such as those involving clock and data recovery sampler calibration. One such method includes receiving an electronic data stream by a clock and data recovery (CDR) circuit comprising a data sampler and an edge sampler. The data stream includes data portions and transitioning portions. The method further includes conducting calibration of the CDR circuit. The calibration includes acquiring samples from the transitioning portions of the data stream using the data sampler; and calibrating the data sampler based at least partially on the samples acquired using the data sampler. The method allows one not only to improve performance, but also to improve yield and reduce testing and screening requirements without requiring any additional circuitry to detect the offsets and works with regular input signals.

23 Claims, 6 Drawing Sheets

CLOCK AND DATA RECOVERY SAMPLER CALIBRATION

BACKGROUND OF THE INVENTION

1. Field of the Invention

Embodiments of the invention relate to circuits, and in particular, to clock and data recovery circuits.

2. Description of the Related Art

In transmitting electronic data from one component to another, a clock is typically used for timing processing the electronic data. In some applications, a clock signal is transmitted along with electronic data from a transmitting component to a receiving component. In other applications, no clock signal is transmitted from a transmitting component to a receiving component. Instead, a clock is derived at the receiving component from electronic data from the transmitting component. Such a scheme is generally referred to as clock and data recovery (CDR).

FIG. 1 illustrates a conventional receiver 100 for receiving electronic data, using a clock and data recovery scheme. The receiver 100 includes an equalizer 110, one or more buffers 120 and a clock and data recovery (CDR) circuit 130. The receiver 100 receives data via a channel from a transmitting component (not shown), but does not receive a separate clock signal.

FIG. 2 illustrates the architecture of a conventional CDR circuit 200. The CDR circuit 200 includes a data sampler 210, an edge sampler 220, a phase detector 230, a phase filter 240, and a phase picker 250. The data sampler 210 and the edge sampler 220 can each include a sampling circuit (sampling the bit stream at a particular time) and a slicer to convert the bit stream to −1 and +1 or to 0 and 1. These components 210-250 together form a CDR feedback loop. The data sampler 210 and the edge sampler 220 provide data samples and edge samples, respectively, to the phase detector 230. The phase detector 230 provides an UP signal and a DOWN signal to the phase filter 240. The phase filter 240 provides a phase selection code to the phase picker 250. The phase picker 250 provides a data clock signal and an edge clock signal to the data sampler 210 and the edge sampler 220, respectively.

The CDR circuit 200 uses a number of clock phases to sample an incoming data signal. FIG. 3 is an example eye diagram 300 for a digital data signal. The eye diagram 300 is a composite of many measurements taken upon separate instances of the incoming signal. The CDR circuit 200 of FIG. 2 samples the incoming data signal at both the midpoints and edges of data eyes (i.e., data valid intervals). The data sampler 210 obtains data samples ( . . . $D_{n-2}$, $D_{n-1}$, $D_n$, $D_{n+1}$, $D_{n+2}$, . . . ) and the edge sampler 220 obtains edge samples ( . . . $E_{n-2}$, $E_{n-1}$, $E_n$, $E_{n+1}$, $E_{n+2}$, . . . ), respectively. If the data samples that bound a given edge sample indicate a transition between high and low states, then the edge sample indicates whether the clock edge used to trigger the edge sampling operation occurred early or late relative to the data signal transition, and therefore may be used to adjust the clock phase.

Referring to expanded view 310, for example, data samples $D_{n-1}$ and $D_n$ are logic "0" and "1" values, respectively, and therefore indicate a rising-edge transition in the incoming data signal. If the edge-sampling clock edge is early relative to the data signal transition, the edge sample will be captured before the data signal crosses decision threshold, DT (i.e., the threshold compared with the incoming signal to resolve the logic state of the edge and data samples), and therefore will have a logic-low ("0") state. If the clock edge is late relative to the data signal transition, the edge sample, $T_n$ will have a logic-high ("1") state. Conversely, in a falling-edge transition of the data signal, a logic "1" edge sample indicates an early clock edge, and a logic "0" edge sample indicates a late clock edge.

Referring back to FIG. 2, these data and edge samples are interpreted by the phase detector 230 which decides if the clock phases are early or late with respect to the data signal. The outcome of this decision is contained in the UP/DOWN signals forwarded from the phase detector 230 to the phase filter 240. The phase filter 240 further processes this information and provides the phase selection code to the phase picker 250. The phase picker 250 uses the selection code to pick which phases out of a number of available phases that will be sent to the samplers 210, 220 to sample the data.

The phase picker 250 provides the data clock signal to the data sampler 210, and the edge clock signal to the edge sampler 220. The data sampler 210 uses the data clock signal for timing the acquisition of data samples from the middle of an eye in an eye diagram (e.g., the eye diagram of FIG. 3). The edge sampler 220 uses the edge clock signal for timing the acquisition of edge samples from the edge of the eye.

By this operation, the phase of the edge clock signal is iteratively adjusted to achieve and maintain alignment between transitions of the edge clock signal and edges of the data eyes. The data clock signal (i.e., the clock signal used to trigger data sampling operations) is phase offset from the edge clock signal such that data clock transitions are evenly spaced in time between leading and trailing edge clock transitions, thereby establishing the data sampling point at the midpoint between edges of the data eyes.

The data samples represent the recovered data and are sent to the output of the CDR circuit 200. Edge samples are not sent to the output of the CDR circuit 200. Both the data and the edge samples are used internally by the CDR circuit 200 to extract phase alignment information as set forth above.

SUMMARY

One embodiment is a method of adjusting timing in a receiver. The method includes: in a normal mode, synchronizing to a serial bit stream using one or more data samplers and one or more edge samplers. The data samplers sample the serial bit stream in a data portion to retrieve data, and the edge samplers sample the serial bit stream in a transition portion for synchronization. The method also includes in an adjustment mode, using the same one or more data samplers to sample the transition portion to indirectly observe a voltage offset at an input of at least one of the one or more data samplers; and adjusting timing based at least partly on the indirectly observed voltage offsets to compensate for the voltage offset.

Another embodiment is an apparatus including one or more data samplers coupled to a bit stream. The bit stream has data portions and transition portions. The apparatus also includes one or more edge samplers coupled to the bit stream; and a clock and data recovery circuit. In a normal mode, the clock and data recovery circuit is configured to provide a data clock signal for the one or more data samplers for sampling of the data portions and to provide an edge clock signal for the one or more edge samplers for sampling of the transition portions. In an adjustment mode, the clock and data recovery circuit is configured to provide the edge clock signal to the one or more data samplers to indirectly observe voltage offsets at inputs of the one or more data samplers. The clock and data recovery circuit is further configured to adjust the data clock signal and/or the edge clock signal to compensate for the indirectly observed voltage offsets.

BRIEF DESCRIPTION OF THE DRAWINGS

These drawings and the associated description herein are provided to illustrate certain embodiments of the invention and are not intended to be limiting.

DETAILED DESCRIPTION OF PREFERRED EMBODIMENTS

Figure 1:
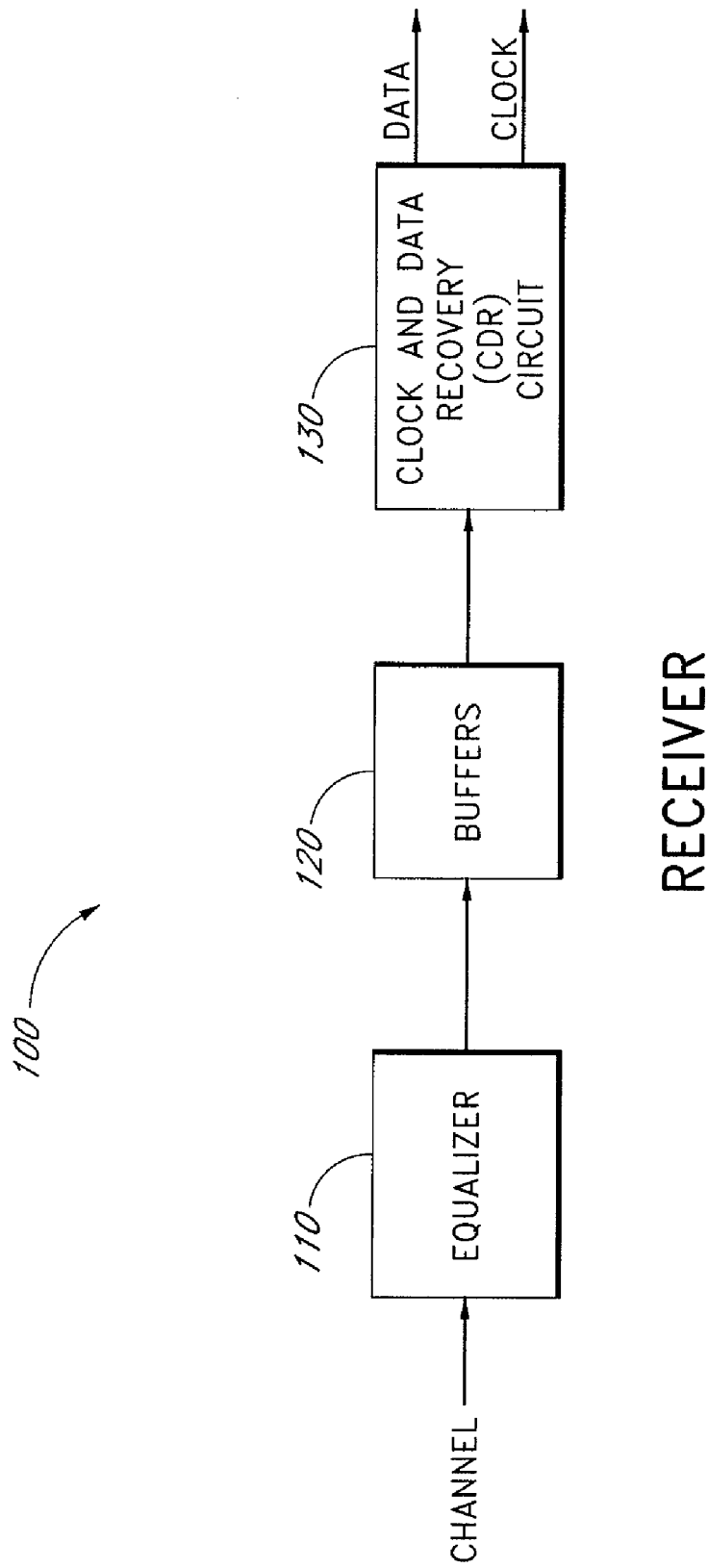
FIG. 1 is a diagram illustrating a conventional receiver including a clock and data recovery circuit.

Although particular embodiments are described herein, other embodiments of the invention, including embodiments that do not provide all of the benefits and features set forth herein, will be apparent to those of ordinary skill in the art. Nothing in this detailed description or the foregoing summary is intended to imply that any particular feature, step or element is essential to the invention.

In conventional CDR circuits, data samplers and edge samplers typically use very small devices to avoid excessively loading the receive path. As such, the samplers are prone to voltage offsets at their inputs (inputs to slicers). These voltage offsets can manifest themselves as timing offsets.

Voltage offsets in the data samplers can cause severe performance degradation. They can cause slow locking, a significant reduction in the bandwidth of the CDR circuit, and ultimately an increase in the bit error rate. These voltage offsets in the data samplers are difficult to detect because there is typically no voltage offset information in the data samples (post slice). This is due to the fact that the signal is typically quite large at the times when the data samples are taken when the CDR is phase-locked, and therefore the average of the data samples just reflects the average density of ones and zeros at the input of the receive path (usually 50%).

On the other hand, voltage offsets in the edge samplers cause relatively little performance degradation. For example, voltage offsets in the edge samplers may only cause a relatively small increase in locking time and slightly smaller bandwidth. In addition, voltage offsets in the edge samplers are relatively easy to detect because when the CDR circuit is in lock, the edge samples contain information about the edge samplers' voltage offsets. Normally, the edge sample average should be 50%; however voltage offsets can cause the average to deviate from 50%. This is due to the fact that the signal is small at the times when the edge samples are taken, and therefore the sampler outputs are more likely to be influenced by voltage offsets. If there are voltage offsets, the average of the edge samples would not be zero as in the ideal case, but would be either positive or negative (for −1, 1 slicing).

Clock and data recovery (CDR) circuits are relatively sensitive to voltage offsets in the data samplers, which are difficult to compensate. If these voltage offsets are compensated, the performance of the CDR circuit would improve in many ways. One embodiment compensates for voltage offsets using timing adjustments.

Clock Data Recovery Circuit Calibration

In one embodiment, an electronic device may include a receiver for receiving and processing an incoming electronic data signal transmitted over a wired channel. In other applications, the embodiments described below may apply to wireless applications. The receiver may include a clock and data recovery (CDR) circuit. In one embodiment, the CDR circuit may use time-interleaved samplers. In such a CDR circuit, some (data samplers) of the samplers sample from the middle of an eye in an eye diagram while other samplers (edge samplers) sample from the edge of the eye in the diagram during a normal operation or mode. In one embodiment, the CDR circuit may have the same configuration as the conventional CDR circuit of FIG. 2 during the normal operation. The samples produced by the data samplers represent the recovered data and are sent to the output of the CDR circuit. Both data samples and edge samples are used internally by the CDR to extract phase alignment information.

Figure 4:
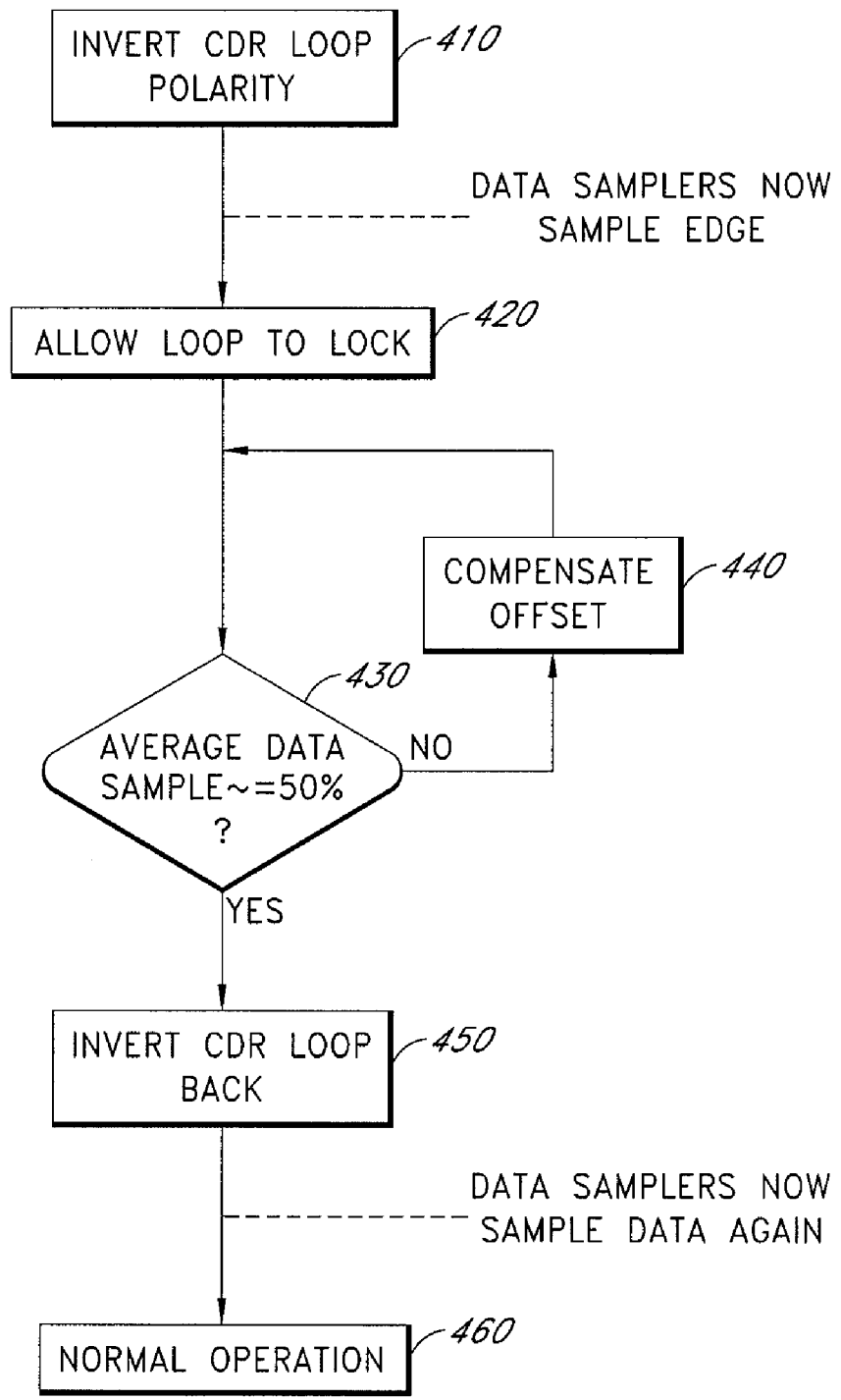
FIG. 4 is a flowchart of one embodiment of a method of calibrating a clock and data recovery circuit.

Referring to FIG. 4, a method of calibrating a clock and data recovery circuit according to one embodiment will be now described. It will be appreciated by the skilled practitioner that the illustrated method can be modified in a variety of ways without departing from the spirit and scope of the invention. For example, various portions of a method can be combined, can be rearranged in an alternate sequence, can be removed, and the like.

The method allows estimation and correction of voltage offsets in data samplers by taking advantage of the fact that voltage offsets in transitions are relatively easy to detect. The method of FIG. 4 will be described in the context of the CDR circuit of FIG. 2. A skilled artisan will, however, appreciate that the method can apply to other configurations of CDR circuits.

Figure 2:
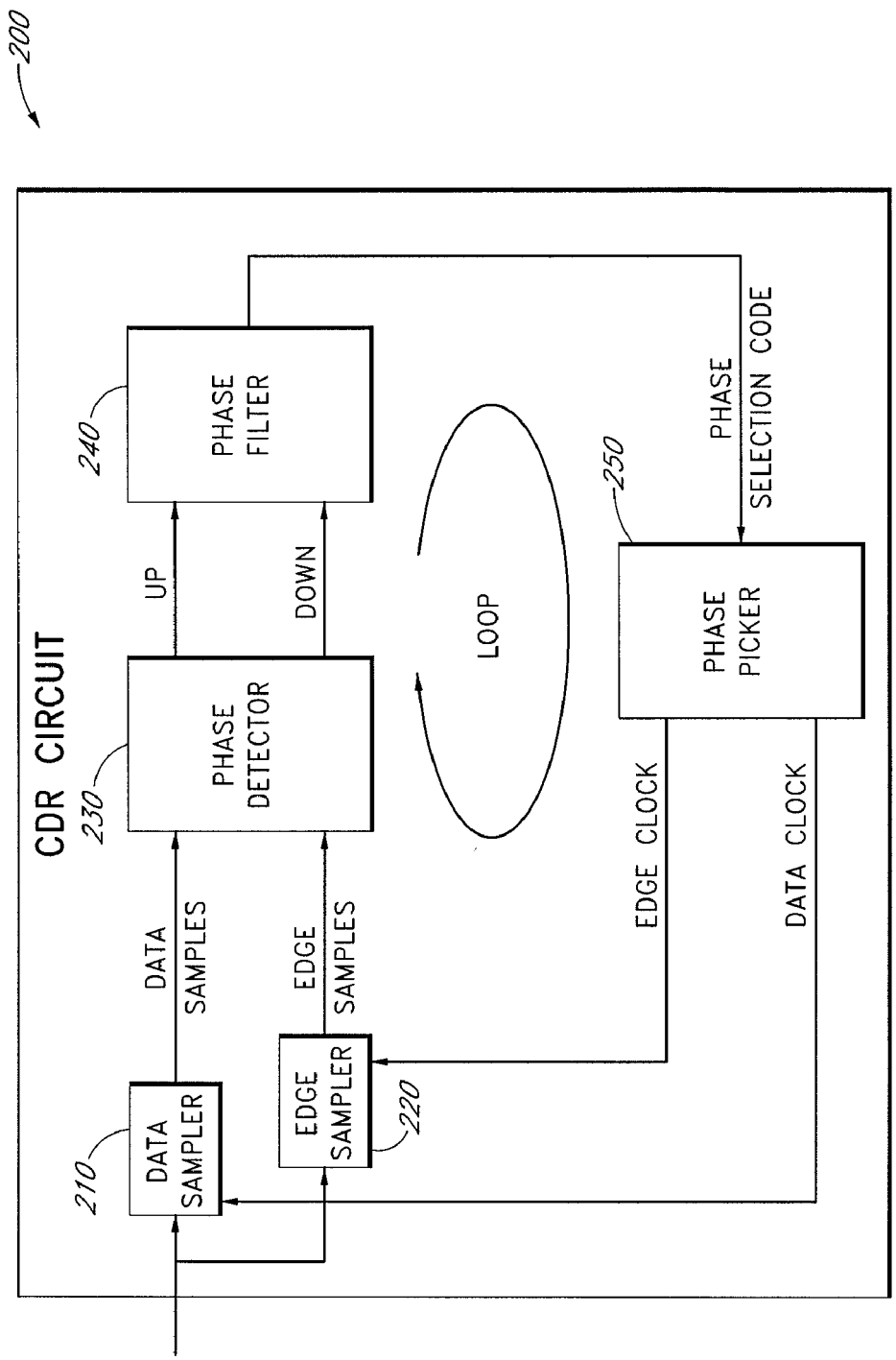
FIG. 2 is a diagram illustrating a conventional clock and data recovery circuit architecture.
Figure 3:
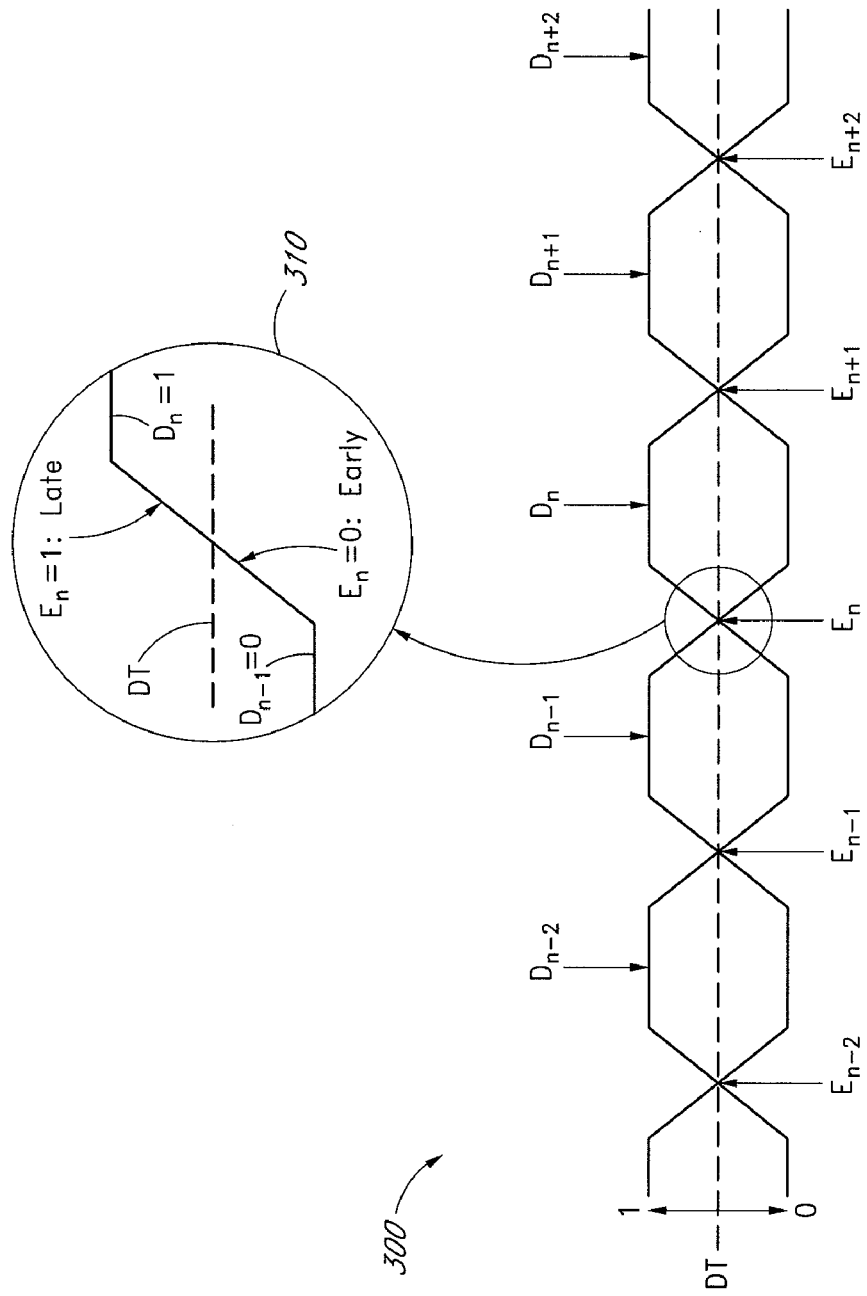
FIG. 3 is an eye diagram of an example digital data signal.

In one embodiment, the CDR feedback loop formed by the components 210-250 of FIG. 2 can serve to adjust the edge clock signal to achieve and maintain alignment between transitions of the edge clock signal and edges of the data eyes during a normal mode of operation. In other words, during the normal mode, the feedback loop has a negative polarity to stabilize the edge clock signal in alignment with the data eyes. In the context of this document, the term "polarity of a feedback loop" refers to whether the feedback provided by the feedback loop is either positive or negative. A skilled artisan will appreciate the meanings of positive and negative feedback.

During a calibration mode of operation (which may be carried out at the start of data transmission or in the middle of data transmission depending on the calibration needs), first, the polarity of the CDR feedback loop is inverted at step 410. As described above, the CDR feedback loop moves in one direction for achieving alignment between the edge clock signal and the data eyes during the normal mode. During the calibration mode, the CDR feedback loop moves in the opposite direction. Inverting the polarity of the CDR feedback loop has the effect that after the CDR circuit is locked, the data samplers and the edge samplers will change roles. In other words, the data samplers sample at the edge of the eye, while the edge samplers sample in the middle of the eye. This permits the same data sampler with a voltage offset in its slicer portion to observe the transitions to assess the data sampler's voltage offset and compensate for the voltage offset. Conventionally, this is not possible as the edge sampler will have a different voltage offset from the data sampler.

In one embodiment, the inversion of the feedback loop polarity may be accomplished by swapping the UP and DOWN signals from the phase detector 230, as shown in FIG.

Figure 5A:
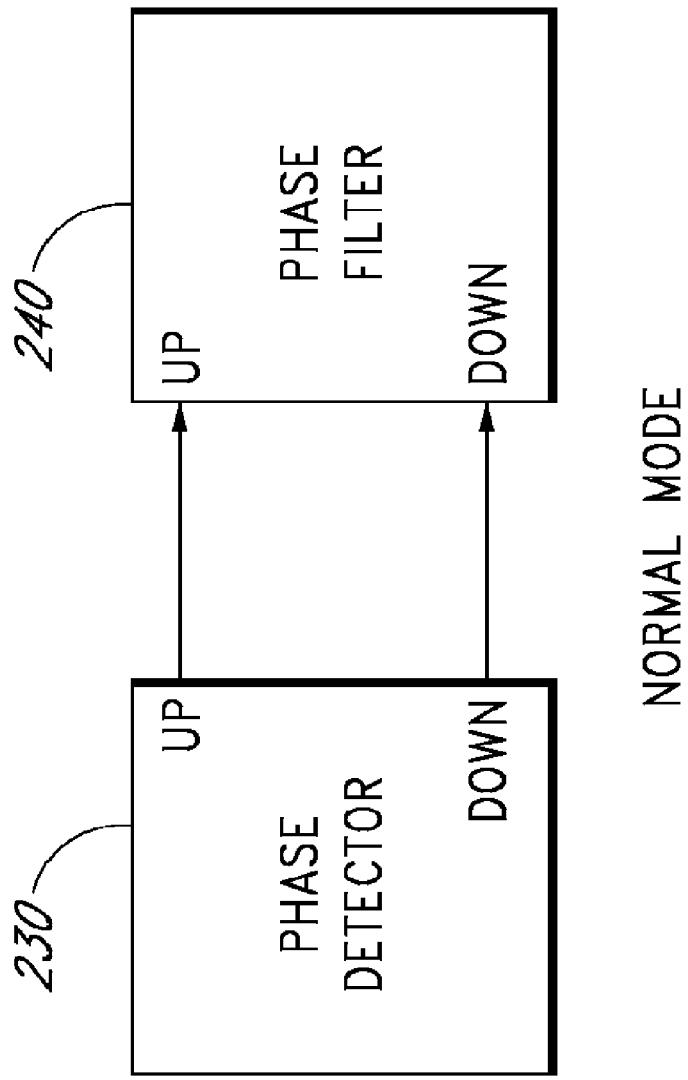
FIGS. 5A and 5B are diagrams illustrating a normal mode and an inversion mode, respectively, of a clock and data recovery circuit according to one embodiment.
Figure 5B:
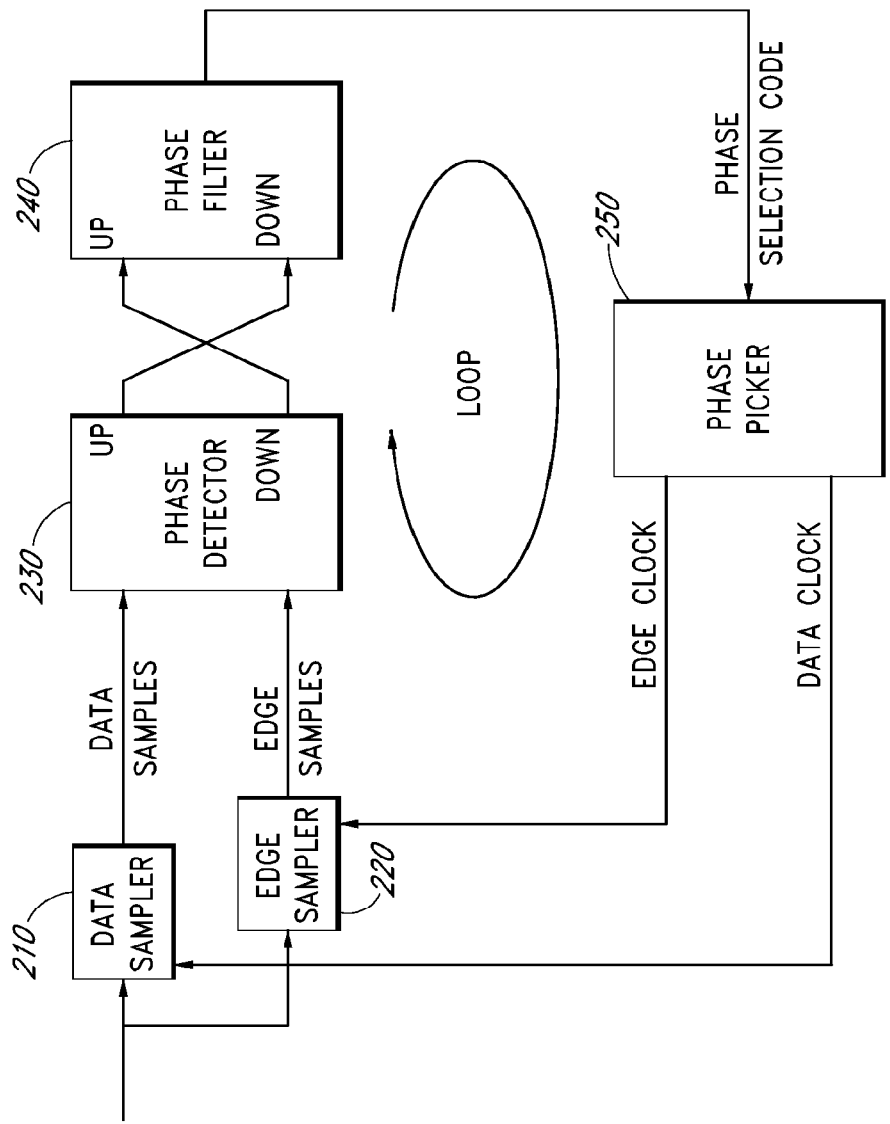

5B. Achieving inversion by swapping the UP and DOWN signals will be described below with reference to FIGS. 2, 5A, and 5B.

In data communications, there are usually two types of transitions, either 0 to 1 or 1 to 0. Suppose that there is a 0 to 1 transition. A 1 to 0 transition is very similar to the 0 to 1 transition, and the principles discussed for the 0 to 1 transition are also applicable to the 1 to 0 transition. During the normal mode, the phase detector 230 usually looks at 3 consecutive samples, a first one in the middle of the eye (in the 0 to 1 transition, this would be a 0), a second one where the transition occurs (which can be either 0 or 1); and a third one in the middle of the next eye (this would be a 1). These 3 samples can be written as 0X1, meaning that the first one is a 0, the second can be either a 0 or a 1, and the third one is a 1. The loop is normally trying to make the likelihood of 0 and 1 equal for the middle bit, as explained below. In one embodiment, the calibration process ignores combinations of bits of 000 or 111, that is, patterns without a transition.

Suppose that the edge clock is sampling early. In this case, the second bit is more likely to be a 0 (so the 3 samples are 001). This is due to the edge clock sampling early, i.e., before the transition or closer to the initial 0. In this case, the phase detector 230 will indicate UP, and the rest of the loop will push the edge clock later and closer to the transition so as to get some 011 again.

Suppose now that the edge clock is sampling late. In this case the second bit is more likely to be a 1 (so the 3 samples are 011). This is due to the edge clock sampling late, i.e., after the transition or closer to the final 1. In this case the phase detector 230 will indicate DOWN, and the rest of the loop will push the edge clock earlier and closer to the transition so as to detect relatively more 001 patterns.

To summarize, when the phase detection is detecting mostly 001 patterns, the loop will push the edge clock so as to obtain relatively more 011 patterns. On the other hand, when the phase detection is detecting mostly 011 patterns, the loop will push the edge clock so as to obtain relatively more 001 patterns. On average, the loop is said to be locked and stable when it gets about equal numbers of 001 and 011 patterns.

In the loop inversion mode in which the UP and DOWN signals are swapped, the loop does the opposite of what it does in the normal mode. Suppose again that there is a 0 to 1 transition. When the edge clock is sampling early (the 3 samples are 001 and the phase detection indicates UP which is now swapped into DOWN), the loop pushes the edge clock even earlier, so as to have even more 001 and less 011 (because the loop is receiving DOWN signals instead of UP signals). This means that the edge clock is moving not closer to the transition, but away from the transition.

Similarly, when the edge clock is sampling late (the 3 samples are 011), the loop pushes the edge clock even late (again, because UP and DOWN are now inverted) so as to obtain even more 011 and less 001. Again the edge clock is moving away from the transition. Since the edge clock is moving away from any transition, it ends up in the middle of the data eye, because at that point it is pushed equally away from the previous transition and away from the next transition. The data clock, which is phase offset from the edge clock, ends up at the transition of the data eye. In this manner, the functions of the data sampler 210 and the edge sampler 220 are swapped.

A skilled artisan will appreciate that the inversion of the feedback loop polarity can be accomplished anywhere in the loop, for example, in the phase detector 230, in the phase filter 240, or in the phase picker 250. A skilled artisan will also appreciate that the inversion can be accomplished in any other suitable manner.

Then, the CDR feedback loop is locked at step 420. In one embodiment, a CDR will has two data samplers 210 and two edge samplers 220 to avoid multiplexing. Subsequently, it is determined if the average of the data samples is 50% at step 430. Because the data sampler 210 is now sampling at the edge or transitioning portion of the eye, its outputs should average 50% (i.e., roughly half zeros and half ones) if there is no voltage offset. If it does not average 50%, it can be at least partially because there is a voltage offset. If there is a positive voltage offset, the average will be more than 50%, and if there is a negative voltage offset, the average will be less than 50%. If the average of the samples is not 50%, a small correction factor can be added to the sampler to partially compensate for the deficiency at step 440. The sign of the correction factor is selected based on the sign of the voltage offset determined at the step 430.

After this step, the average of the data samples is determined again at step 430. In one embodiment, compensation for voltage offset is repeated until the average is brought as close as possible to 50%. When the average of the samples is determined to be about 50%, i.e., the data samplers' voltage offsets have been compensated by a timing adjustment, the process goes to step 450.

After the voltage offsets have been corrected, the CDR feedback loop is inverted back for the normal operation at step 450 such that data sampler samples in the middle of the eye and the edge sampler samples at the edge or transitioning portion of the eye. At this point, the CDR circuit operates with lower timing offsets in the data samplers and therefore has improved performance.

In other embodiments, the method described above can be applied not just to voltage offsets in the CDR data samplers, but to voltage offsets in the entire receive path up to and including the CDR data samplers. Typically, the equalizer and buffers (see FIG. 1) have their own voltage offset correction, and the CDR timing offset correction can cover those voltage offsets as well, assuming that they do not distort the signal too much.

In certain embodiments, the method described above can be applied to CDR circuits that include multiple data samplers and edge samplers. For example, a CDR circuit can have two or more data samplers and two or more edge samplers and the method described above can be applied to such a CDR circuit.

The method described above is not limited to CDR circuits or receive paths that sample twice during each data period (once to acquire a data sample and once to acquire an edge sample). For examples, the method can be adapted for CDR circuits that sample data more than twice during each data period. In certain embodiments, the method described above can be used with double data rate schemes such as DDR, DDR2, and DDR3 schemes. As long as at least one particular sampler can be corrected for voltage offset, this method can be used to rotate the other samplers so as to fall in the position of the sampler that can be corrected for voltage offset.

The correction of voltage offsets in the samplers of the clock and data recovery (CDR) circuits is desirable for high-speed high-performance links. This method allows one not just to improve performance, but also to improve yield and reduce testing and screening requirements without requiring any additional circuitry to detect the voltage offsets and works with regular input signals. The embodiments described in this disclosure provide a simple and practical method of correcting voltage offsets in the data and clock recovery circuits.

The embodiments described above can apply to various electronic devices. Examples of the electronic devices can include, but are not limited to, consumer electronic products, electronic circuits, electronic circuit components, parts of the consumer electronic products, electronic test equipments, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Various embodiments of the invention have been described herein. Although this invention has been described with reference to these specific embodiments, the descriptions are intended to be illustrative of the invention and are not intended to be limiting. Various modifications and applications may occur to those familiar with the subject without departing from the true spirit and scope of the invention as defined in the appended claims.

What is claimed is:

1. A method of adjusting voltage offset in a receiver, the method comprising:
   in a normal mode, synchronizing to a serial bit stream using one or more data samplers and one or more edge samplers, wherein the data samplers sample the serial bit stream in a data portion to retrieve data, and the edge samplers sample the serial bit stream in a transition portion for synchronization;
   in an adjustment mode, using the same one or more data samplers to sample the transition portion to observe a voltage offset at an input of at least one of the one or more data samplers; and
   compensating for the voltage offset of the one or more data samplers based at least partly on the observed voltage offsets.

2. The method of claim 1, wherein the adjustment mode further comprises:
   oversampling a serial bit stream such that 3 consecutive samples correspond to a first data portion, a transition portion, and a second data portion, wherein at least the transition portion is sampled by a sampler from the one or more data samplers;
   collecting a plurality of data sets of the 3 consecutive samples;
   selecting data sets wherein the 3 consecutive samples correspond to 0 to 1, 1 to 0, or both 0 to 1 and 1 to 0 for the first data portion and the second data portion, respectively; and
   adjusting timing based at least partly on data for the transition portions of the selected data sets.

3. The method of claim 1, further comprising compensating for the voltage offset such that an average of samples is adjusted in a direction towards 50% ones and 50% zeroes.

4. The method of claim 1, wherein compensating for the voltage offset comprises:
   generating an average value from transition portions sampled by the one or more data samplers in the adjustment mode; and
   compensating for the voltage offset based at least partly on the average value.

5. The method of claim 1, further comprising: providing a first clock signal to the data samplers and a second clock signal to the edge samplers in the normal mode;
   and providing the first clock signal to the edge samplers and the second clock signal to the data samplers in the adjustment mode.

6. The method of claim 1, wherein the adjustment mode is performed prior to the normal mode.

7. The method of claim 1, further comprising repetitively switching between the normal mode and the adjustment mode.

8. The method of claim 1, further comprising adjusting timing based at least partly on the indirectly observed voltage offsets to compensate for the voltage offset.

9. The method of claim 1, further comprising adding a correction factor to the data sampler to compensate for the voltage offset.

10. An apparatus comprising:
    one or more data samplers coupled to a bit stream, the bit stream having data portions and transition portions;
    one or more edge samplers coupled to the bit stream; and
    a clock and data recovery circuit, wherein in a normal mode, the clock and data recovery circuit is configured to provide a data clock signal for the one or more data samplers for sampling of the data portions and to provide an edge clock signal for the one or more edge samplers for sampling of the transition portions, wherein in an adjustment mode, the clock and data recovery circuit is configured to provide the edge clock signal to the one or more data samplers to observe voltage offsets at inputs of the one or more data samplers, the clock and data recovery circuit being further configured to compensate for the voltage offsets based at least partly on the observed voltage offsets.

11. The apparatus of claim 10, wherein the data clock signal and the edge clock signal are different phases of the same clock signal.

12. The apparatus of claim 10, wherein the clock and data recovery circuit is further configured to swap the data clock signal and the edge clock signal for the normal mode and for the adjustment mode.

13. The apparatus of claim 10, wherein the data samplers and the edge samplers are configured to oversample a serial bit stream during the adjustment mode such that 3 consecutive samples correspond to a first data portion, a transition portion, and a second data portion,
    wherein at least the transition portion is sampled by a sampler from the one or more data samplers,
    wherein the clock and data recovery circuit is further configured to collect a plurality of data sets of the 3 consecutive samples, and to select data sets wherein the 3 consecutive samples correspond to 0 to 1, 1 to 0, or both 0 to 1 and 1 to 0 for the first data portion and the second data portion, respectively, and
    wherein the clock and data recovery circuit is further configured to adjust timing based at least partly on data for the transition portions of the selected data sets.

14. The apparatus of claim 10, wherein the clock and data recovery circuit is further configured to compensate for the voltage offset such that an average of samples is adjusted in a direction towards 50% ones and 50% zeroes.

15. The apparatus of claim 10, wherein the data samplers are configured to sample the transition portions in the adjustment mode.

16. The apparatus of claim 15, wherein the clock and data recovery circuit is further configured to generate an average value from the transition portions sampled by the data samplers in the adjustment mode, and to compensate for the voltage offset, based at least partly on the average value.

17. The apparatus of claim 15, wherein the clock and data recovery circuit comprises a feedback loop having a polarity for timing sampling of the data samplers such that the data samplers sample the data portions in the normal mode, wherein the clock and data recovery circuit is further configured to invert the polarity of the feedback loop in the adjustment mode such that the data samplers sample the transition portions.

18. The apparatus of claim 17, wherein the clock and data recovery circuit comprises:
   a phase detector configured to receive outputs from one of the data samplers and one of the edge samplers, and to output a first signal and a second signal; and
   a phase filter including a first input and a second input, the phase filter being configured to receive the first and second signals at the first and second inputs, respectively, in the normal mode, the phase filter being further configured to receive the first signal at the second input and the second signal at the first input in the adjustment mode.

19. The apparatus of claim 17, wherein the phase filter is further configured to provide a phase selection code at least partly in response to the first and second signals, wherein the clock and data recovery circuit further comprises a phase picker configured to provide a first clock signal and a second clock signal at least partly in response to the phase selection code, and wherein the data samplers and edge samplers are configured to be synchronized with the first and second clock signals, respectively, in the normal mode.

20. The apparatus of claim 19, wherein the data samplers are configured to be synchronized with the second clock signal in the adjustment mode, wherein the edge samplers are configured to be synchronized with the first clock signal in the adjustment mode.

21. The apparatus of claim 10, wherein at least one of the data samplers is configured to take a plurality of samples during a period of the data clock signal.

22. The apparatus of claim 10, wherein the clock and data recovery circuit is further configured to adjust at least one of the data clock signal or the edge clock signal to compensate for the observed voltage offsets.

23. The apparatus of claim 10, wherein the clock and data recovery circuit is further configured to add a correction factor to the data sampler to compensate for the voltage offsets.

* * * * *